US010958274B2

(12) United States Patent
Najafi-Yazdi et al.

(10) Patent No.: US 10,958,274 B2
(45) Date of Patent: Mar. 23, 2021

(54) MICROWAVE DEVICE AND METHOD OF OPERATION

(71) Applicant: ANYON SYSTEMS INC., Dorval (CA)

(72) Inventors: Alireza Najafi-Yazdi, Vaudreuil-Dorion (CA); Gabriel Ethier-Majcher, Montreal (CA)

(73) Assignee: ANYON SYSTEMS INC., Dorval (CA)

( * ) Notice: Subject to any disclaimer, the term of this patent is extended or adjusted under 35 U.S.C. 154(b) by 0 days.

(21) Appl. No.: 16/805,047

(22) Filed: Feb. 28, 2020

(65) Prior Publication Data

US 2020/0280317 A1    Sep. 3, 2020

Related U.S. Application Data

(60) Provisional application No. 62/812,557, filed on Mar. 1, 2019.

(51) Int. Cl.
| | |
|---|---|
| *H03K 19/19* | (2006.01) |
| *H03K 19/195* | (2006.01) |
| *G11C 11/44* | (2006.01) |
| *G06N 10/00* | (2019.01) |

(52) U.S. Cl.
CPC ......... *H03K 19/1952* (2013.01); *G06N 10/00* (2019.01); *G11C 11/44* (2013.01)

(58) Field of Classification Search
CPC ..... G06N 10/00; G11C 11/44; H03K 19/1952
See application file for complete search history.

(56) References Cited

U.S. PATENT DOCUMENTS

| | | | |
|---|---|---|---|
| 9,444,430 B1* | 9/2016 | Abdo | H01L 39/223 |
| 9,509,280 B1 | 11/2016 | Abdo et al. | |
| 9,692,423 B2* | 6/2017 | McDermott | H03K 19/1958 |
| 9,729,152 B2 | 8/2017 | Bronn et al. | |
| 10,127,500 B2* | 11/2018 | Abdo | G01V 8/005 |
| 2016/0112031 A1* | 4/2016 | Abraham | H03K 19/1954 |
| | | | 327/528 |
| 2016/0156356 A1* | 6/2016 | Bronn | B82Y 10/00 |
| | | | 326/5 |

(Continued)

FOREIGN PATENT DOCUMENTS

WO    2018052427 A1    3/2018

OTHER PUBLICATIONS

Reed, M.D. et al., "Fast Reset and Suppressing Spontaneous Emission of a Superconducting Qubit", arXiv:1003.0142v2 [cond-mat.mes-hall] May 31, 2010, pp. 1-4.

(Continued)

*Primary Examiner* — Kurtis R Bahr
(74) *Attorney, Agent, or Firm* — Norton Rose Fulbright Canada LLP

(57) ABSTRACT

There is described a microwave device and methods of operating same. The device comprises at least one superconducting qubit coupled to a transmission line defining a first port, and a filter. The filter comprises a first resonant element having a first resonance frequency $f_1$, positioned along the transmission line between the first port and the qubit, and a second resonant element having a second resonance frequency $f_2$ different from $f_1$ and positioned along the transmission line between the first resonant element and the qubit.

20 Claims, 15 Drawing Sheets

(56) References Cited

U.S. PATENT DOCUMENTS

| | | | |
|---|---|---|---|
| 2019/0229690 A1* | 7/2019 | White | H03K 19/1954 |
| 2020/0028480 A1* | 1/2020 | Abdo | H03H 7/175 |
| 2020/0074344 A1* | 3/2020 | Abdo | G06N 10/00 |
| 2020/0320423 A1* | 10/2020 | Kelly | G06N 10/00 |

OTHER PUBLICATIONS

Kelly, J. et al., "State preservation by repetitive error detection in a superconducting quantum circuit", arXiv:1411.7403 [quant-ph], 2015, pp. 1-30.

Jeffrey, E. et al., "Fast Accurate State Measurement with Superconducting Qubits", Physical Review Letters, 112, 190504, May 16, 2014, pp. 1-5.

Heinsoo, J. et al., "Rapid high-delity multiplexed readout of superconducting qubits", arXiv:1801.07904v1 [quant-ph] Jan. 24, 2018, pp. 1-13.

Ethier-Majcher, G. et al., "Abstract: R35.00005 : A tunable Purcell filter design for multiplexed qubit readout", APS Physics, Bulletin of the American Physical Society, APS March Meeting 2019, vol. 64, No. 2, https://meetings.aps.org/Meeting/MAR19/Session/R35.5.

Johnson, "Controlling Photons in Superconducting Electrical Circuits", A Dissertation Presented to the Faculty of the Graduate School of Yale University, May 2011, 190 pages.

Sank, "Fast, Accurate State Measurement in Superconducting Qubits", A dissertation submitted in partial satisfaction of the requirements for the degree of Doctor of Philosophy in Physics, Sep. 2014, 247 pages.

Houck, A.A. et al., "Controlling the spontaneous emission of a superconducting transmon qubit", arXiv:0803.4490v1 [cond-mat.mes-hall] Mar. 31, 2008, pp. 1-4.

Sete, E. A. et al., "Quantum theory of a bandpass Purcell filter for qubit readout", arXiv:1504.06030v2 [quant-ph] Jul. 22, 2015, pp. 1-15.

Bronn, N. T. et al., "Reducing Spontaneous Emission in Circuit Quantum Electrodynamics by a Combined Readout/Filter Technique", arXiv:1504.04353v2 [quant-ph] Oct. 20, 2015, pp. 1-9.

* cited by examiner

US 10,958,274 B2

MICROWAVE DEVICE AND METHOD OF OPERATION

CROSS-REFERENCE TO RELATED APPLICATIONS

The present application claims the benefit of U.S. Provisional Patent Application No. 62/812,557 filed on Mar. 1, 2019, the contents of which are hereby incorporated by reference.

TECHNICAL FIELD

The present disclosure relates generally to superconducting quantum computing, and more particularly to microwave circuitry involving qubits.

BACKGROUND OF THE ART

Superconducting qubits are among the leading candidates to implement a quantum processor. Depending on how the quantum information is encoded, the superconducting qubits are generally categorized into three categories: charge qubits (including transmon qubits), flux qubits, and phase qubits.

In order to measure the state of a qubit, the qubit may be coupled to a microwave resonator. The resonance frequency of the microwave resonator shifts based on the quantum state of the qubit. This provides a methodology to read the state of the qubit by probing the resonance frequency of the microwave resonator. This may be achieved by coupling the microwave resonator to a microwave transmission line and measuring the amplitude and phase of a probe signal. One drawback of this scheme is that the microwave transmission line provides a channel for the qubit to decay by spontaneous emission. This has a detrimental effect on the lifetime of the qubit.

Therefore, improvements are needed.

SUMMARY

In accordance with a broad aspect, there is provided a microwave device. The device comprises a transmission line defining a first port, at least one superconducting qubit coupled to the transmission line, and a filter. The filter comprises at least two resonant elements. A first resonant element has a first resonance frequency $f_1$ and is positioned along the transmission line between the first port and the qubit. A second resonant element has a second resonance frequency $f_2$ different from $f_1$ and is positioned along the transmission line between the first resonant element and the qubit.

In accordance with another broad aspect, there is provided a method for operating a microwave device having at least one superconducting qubit. The method comprises coupling the at least one qubit to a transmission line defining at least one port and filtering emissions of the at least one qubit to the transmission line using a filter. The filter comprises at least two resonant elements. A first resonant element has a first resonance frequency $f_1$ and is positioned along the transmission line between the first port and the qubit. A second resonant element has a second resonance frequency $f_2$ different from $f_1$ and is positioned along the transmission line between the first resonant element and the qubit.

Features of the systems, devices, and methods described herein may be used in various combinations, in accordance with the embodiments described herein.

BRIEF DESCRIPTION OF THE DRAWINGS

Reference is now made to the accompanying Figs. in which.

It will be noted that throughout the appended drawings, like features are identified by like reference numerals.

DETAILED DESCRIPTION

Figure 1:
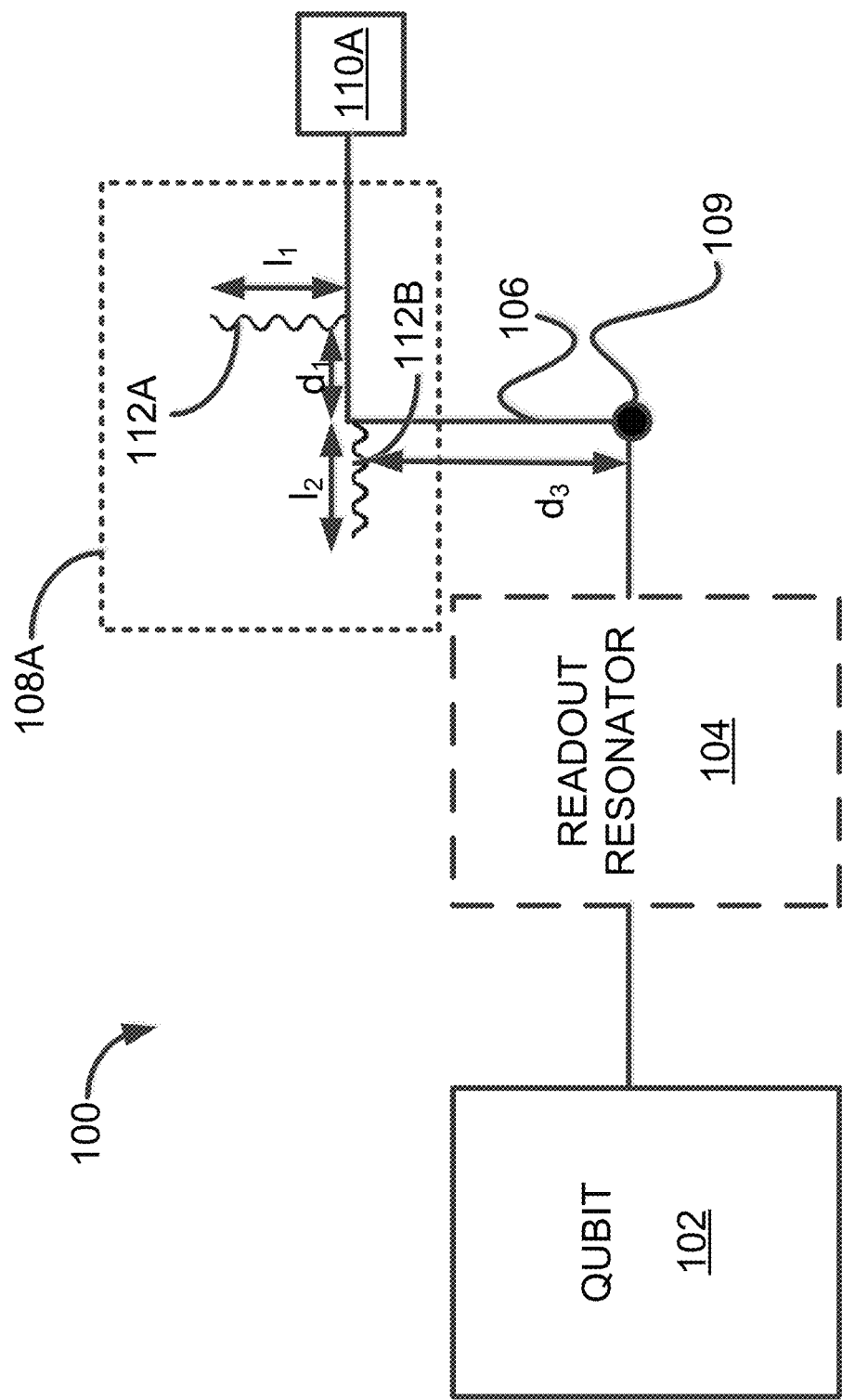
FIG. 1 is a diagram illustrating an example of a single-port microwave device, in accordance with at least some embodiments.

FIG. 1 illustrates a microwave device 100. At least one superconducting qubit 102 is coupled to a transmission line 106. The transmission line 106 defines a first port 110a, which may be used as an input port to inject a microwave signal into the microwave device 100 and measure a reflection of the microwave signal. In some embodiments, the qubit 102 is coupled to the transmission line 106 through a readout resonator 104. One or more other component, for example a capacitor, may be used in addition to or instead of the readout resonator 104 to couple the qubit 102 to the transmission line 106.

In the example illustrated, the resonator 104 is coupled to the transmission line 106 at a connection node 109, for example via a capacitor or a mutual inductance. In some embodiments, a plurality of qubits 102 are each coupled to a different resonator 104, and each resonator 104 is coupled to the transmission line 106 at a different node 109. In some embodiments, port 110a is used as an input port for the microwave signal and a separate port is provided as an output port. Alternatively, port 110a is used as an output port and a separate port is provided as an input port. It will be understood that the readout resonator 104 is present only in the case of quantum readout and may thus be omitted in certain circumstances.

The qubit 102 may be any type of flux qubit or charge qubit, including a transmon qubit. The resonator 104 may be a transmission line stub, a waveguide cavity, another qubit or an LC oscillator.

A filter 108a is provided to counter spontaneous emission of the qubit 102, i.e. energy loss of the qubit 102 through the resonator 104 into the transmission line 106. The filter 108a may thus be referred to as a Purcell filter. The filter 108a is a microwave filter placed between the qubit 102 and the port 110a to limit transmission at the qubit frequency while maintaining good transmission at the resonator frequency.

The filter 108a may be a stop-band (or notch) filter provided between the first port 110a and the connection node 109. The filter 108a comprises at least two resonant elements. FIG. 1 shows an example with two resonant elements. In some embodiments, more than two resonant elements are provided. The first resonant element 112a has a first resonant frequency $f_1$ and is positioned between the first port 110a and the connection node 109. The second resonant element 112b has a second resonant frequency $f_2$ different from $f_1$, and is positioned between the first resonant element 112a and the connection node 109 at a distance $d_3$ from the connection node 109. Note that in some embodiments, $d_3=0$. The resonant elements 112a, 112b, may be transmission line stubs, cavities, LC oscillators, and the like.

In the case of open-circuited quarter wavelength stubs for example, the resonance frequency of a stub is related to its length l, according to:

$$f_i = \frac{c}{(4l_i)\sqrt{\epsilon_r \mu_r}}$$

where c is the speed of light in vacuum and $\epsilon_r$ and $\mu_r$ are the relative effective permittivity and permeability of the stub. The resonant elements 112a, 112b may be spaced apart by a distance $d_1$. Note that in some embodiments, $d_1=0$.

Figure 2:
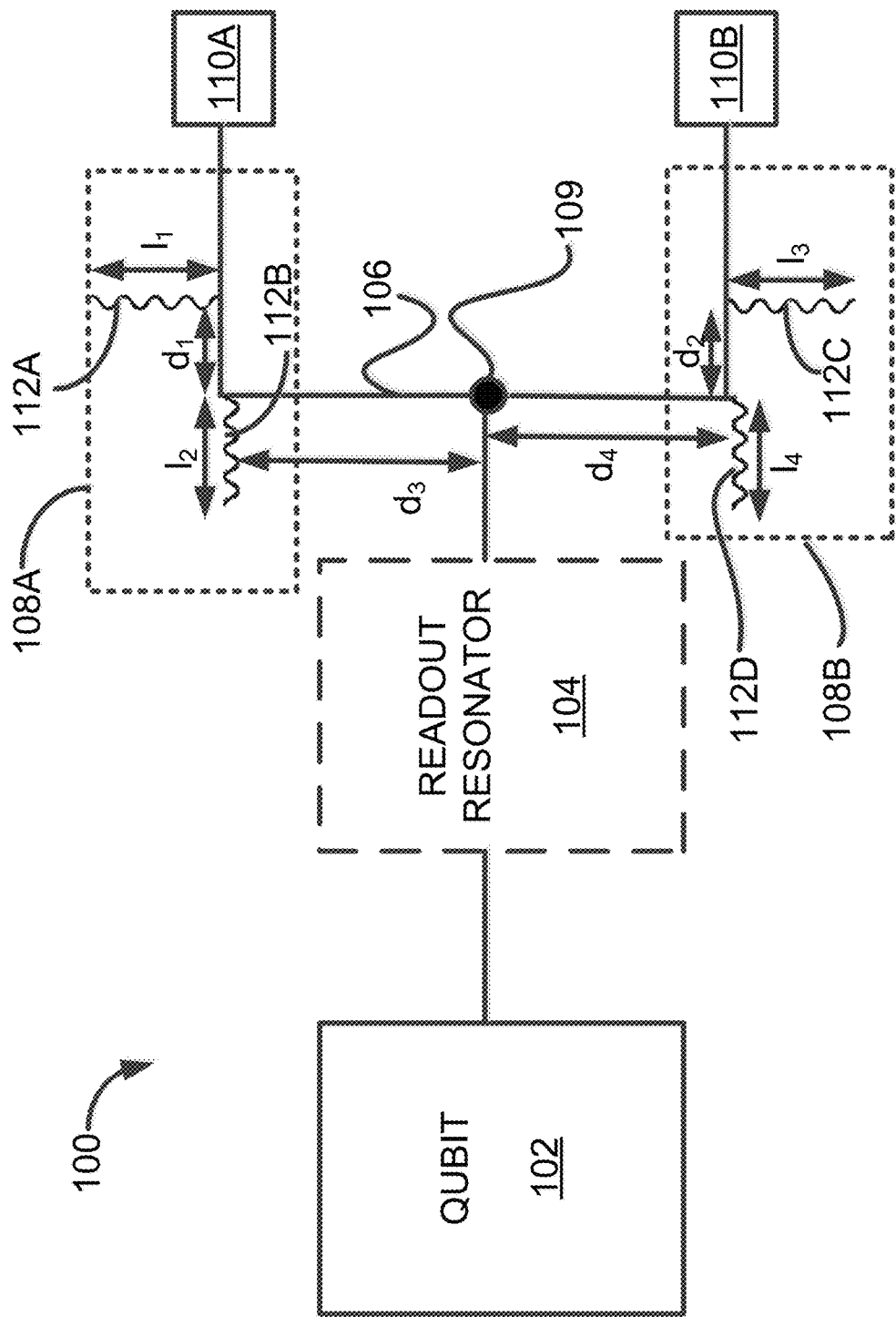
FIG. 2 is a diagram illustrating an example of a dual-port microwave device, in accordance with at least some embodiments.

FIG. 2 illustrates a dual-port embodiment of the microwave device 100. The transmission line 106 further defines a second port 110b. A second filter 108b is provided between port 110b and connection node 109. A third resonant element 112c having a third resonance frequency $f_3$ is positioned between the second port 110b and the connection node 109. A fourth resonant element 112d having a fourth resonance frequency $f_4$ is positioned between the third resonant element 112c and the connection node 109 at a distance $d_4$ from the connection node 109. Note that in some embodiments, $d_4=0$.

The resonant elements 112c, 112d have resonance frequencies $f_3$ and $f_4$ respectively. They are spaced apart by a distance $d_2$. Note that in some embodiments, $d_2=0$. In some embodiments, each resonant element 112a-112d may be open-circuited or short-circuited stubs.

In some embodiments, filters 108a and 108b are symmetric, meaning that the third resonance frequency $f_3$ is the same as the first resonance frequency $f_1$, and the fourth resonance frequency $f_4$ is the same as the second resonance frequency $f_2$. In some embodiments, symmetry is also provided with distances $d_1=d_2$ and/or $d_3=d_4$.

In some embodiments, the filters 108a, 108b are asymmetric, i.e the third resonance frequency $f_3$ is the same as the second resonance frequency $f_2$, and the fourth resonance frequency $f_4$ is the same as the first resonance frequency $f_1$.

Figure 3A:
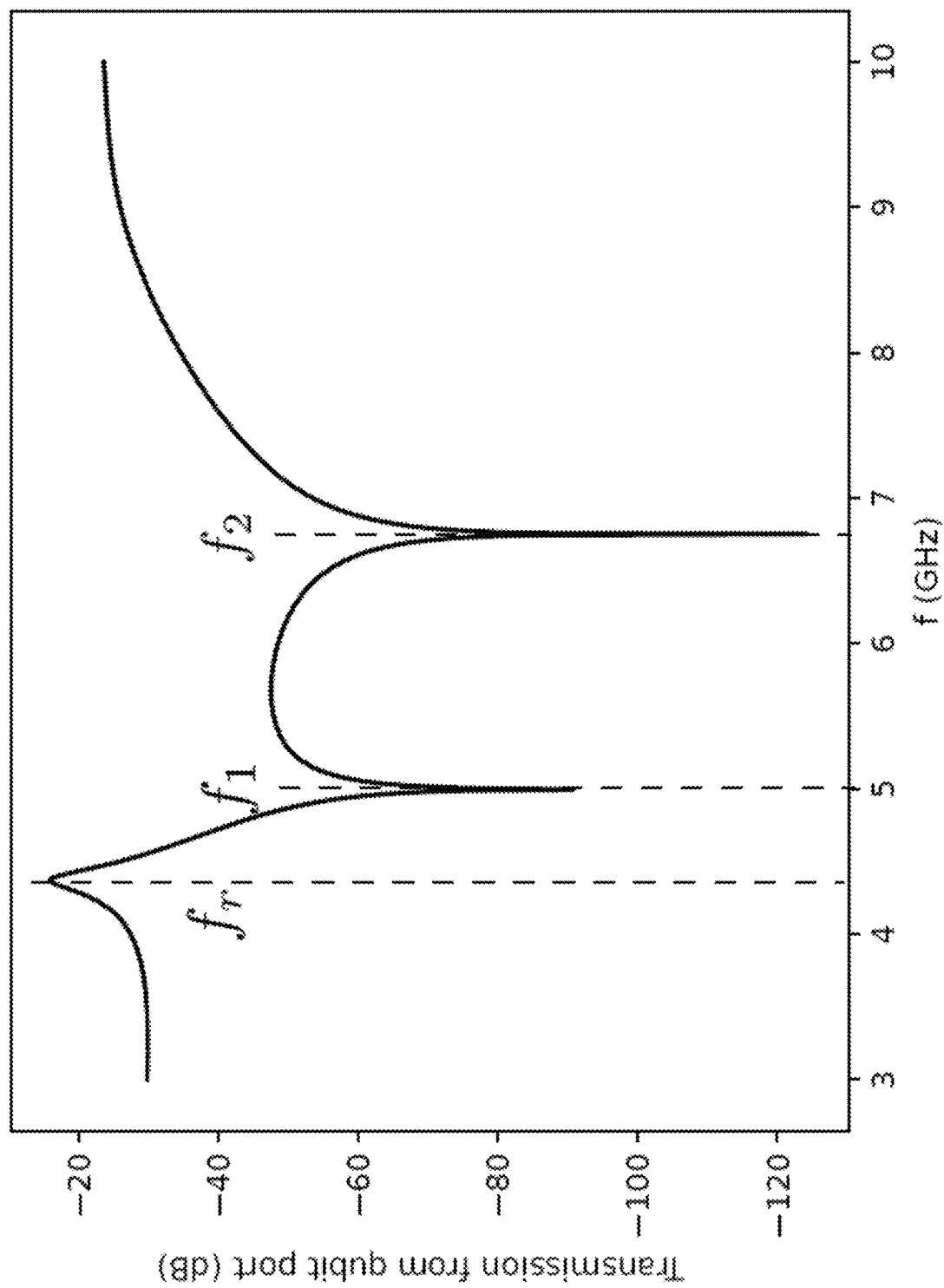
FIGS. 3A-3B are graphs of a frequency response of a single-port filter, in accordance with at least some embodiments.

FIG. 3A illustrates an example transmission coefficient for the device 100 shown in FIG. 1, in which the qubit 102 and resonator 104 have been replaced by a port (the "qubit port") for the purpose of simulation. The qubit port is spaced from the second resonant element by a distance $d_3=1.0$ mm The resonant elements 112a and 112b are open-circuited quarter wavelength stubs of length $l_1=6.0$ mm and $l_2=4.44$ mm separated by a distance $d_1=3.0$ mm. FIG. 3A illustrates the transmission coefficient between the qubit port and port 110a and has dips at frequencies $f_1=5$ GHz and $f_2=6.75$ GHz that define a stopband of reduced transmission around the qubit frequency. The transmission coefficient also exhibits a peak at a frequency $f_r$ that can be attributed to the two stubs as well as the $d_1$ transmission line segment between them forming a half-wave resonator. In some embodiments, the readout resonator frequency is within this high transmission peak.

Figure 3B:
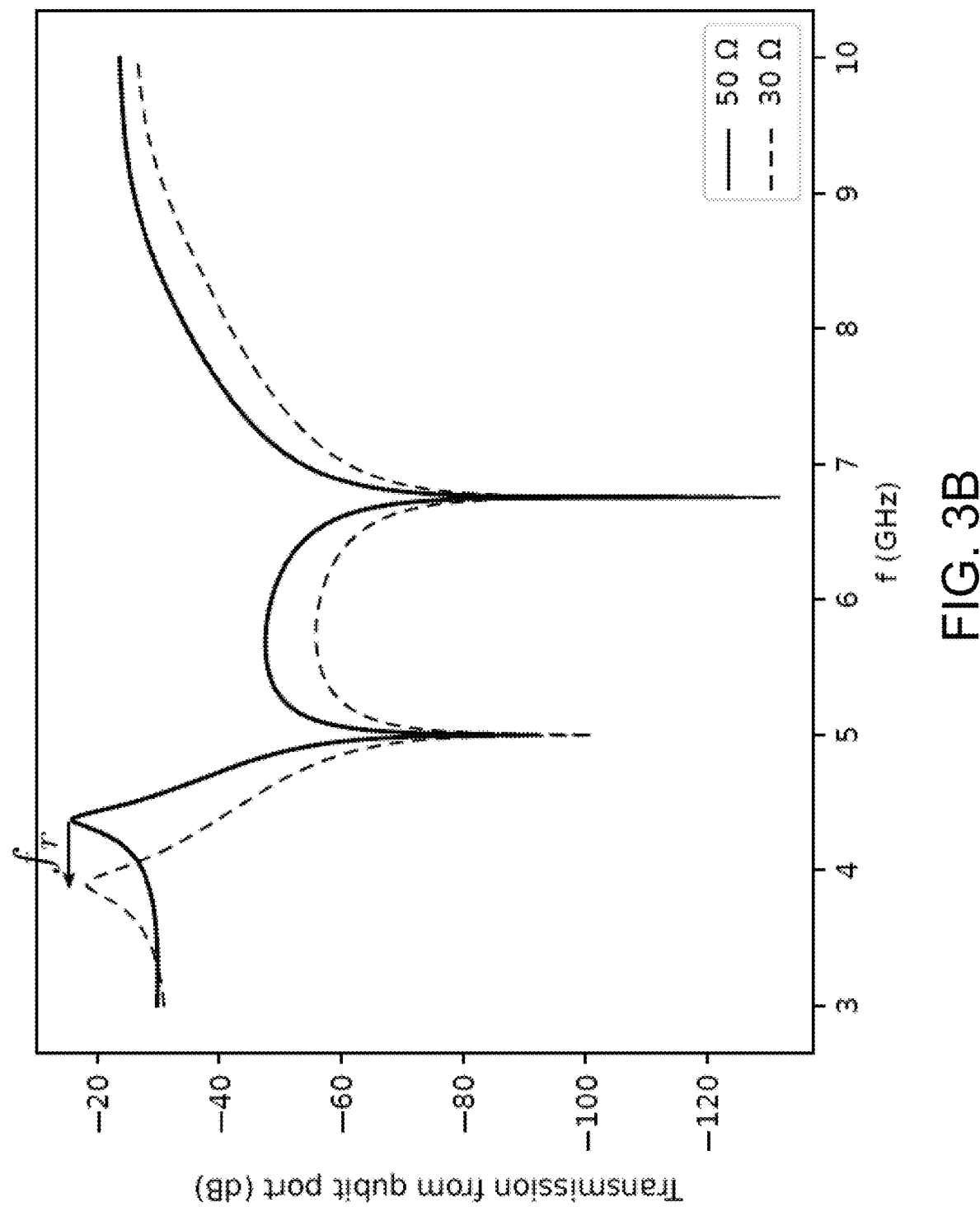

The frequency response of FIG. 3A was obtained with $\epsilon_r=6.25$ and $\mu_r=1$. The impedance of port 110a was set to 50Ω and that of the qubit port 1000 times larger. The characteristic impedance used for all transmission line segments here is 50Ω, but it could take on different values for different line segments. For example, a smaller characteristic impedance for the stubs allows to widen the stopband. Indeed, FIG. 3B compares the transmission coefficient of FIG. 3A (with a characteristic impedance of 50Ω for the stubs and the transmission line) with a transmission coefficient where the characteristic impedance of the two stubs is 30 Ω and that of the transmission line is 50Ω. This shifts the frequency of the $f_r$ resonance. Note that leaving the characteristic impedance of the two stubs unchanged and increasing instead the characteristic impedance of the $d_1$ segment between the two stubs has a similar effect.

Figure 4A:
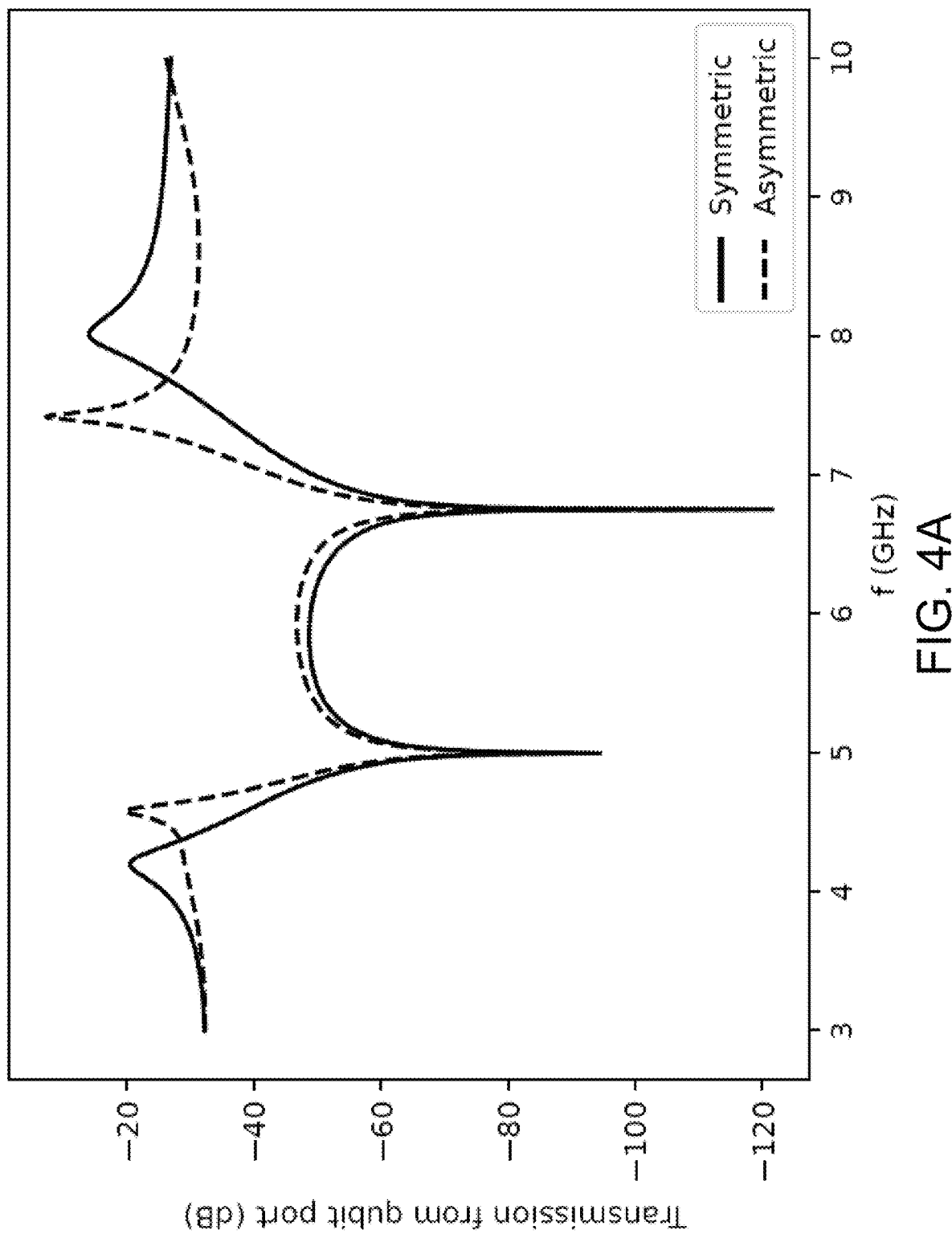
FIGS. 4A-4B are graphs of a frequency response of a dual-port filter having a symmetric layout and an asymmetric layout, in accordance with at least some embodiments.

FIG. 4A is a graph comparing the frequency response for a dual-port symmetric ($l_4=l_2=4.44$ mm and $l_3=l_1=6.0$ mm) filter design with the frequency response for an asymmetric ($l_4=l_1=6.0$ mm and $l_3=l_2=4.44$ mm) filter design. Both designs use $d_1=d_2=3.0$ mm and $d_3=d_4=3.0$ mm as well as the same values listed above for the other parameters. FIG. 4A plots the overall transmission coefficient from the qubit port, to ports 110a and 110b combined, for the symmetric and asymmetric designs.

Figure 4B:
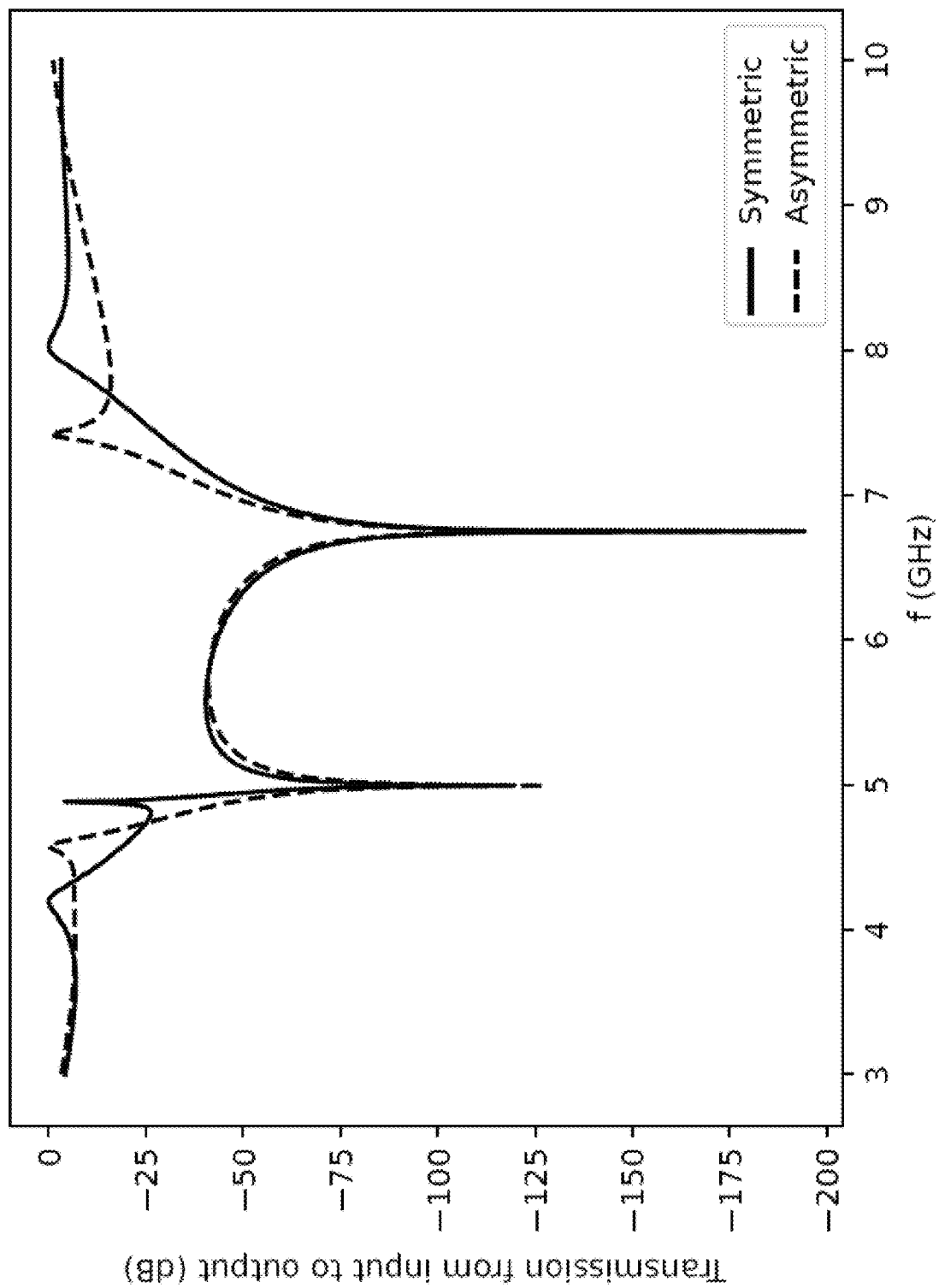

For a dual-port device, when applying an input signal at one port (say port 110a) and reading the output signal at the other port (say port 110b), the transmission coefficient from the input port to the output port should be high at the frequency of the readout resonator. FIG. 4B plots the transmission coefficient of the symmetric and asymmetric filters from input to output port. For both designs, high transmission bands are provided at frequencies both below and above the stopband that may be suitable for the readout resonators.

Figure 5:
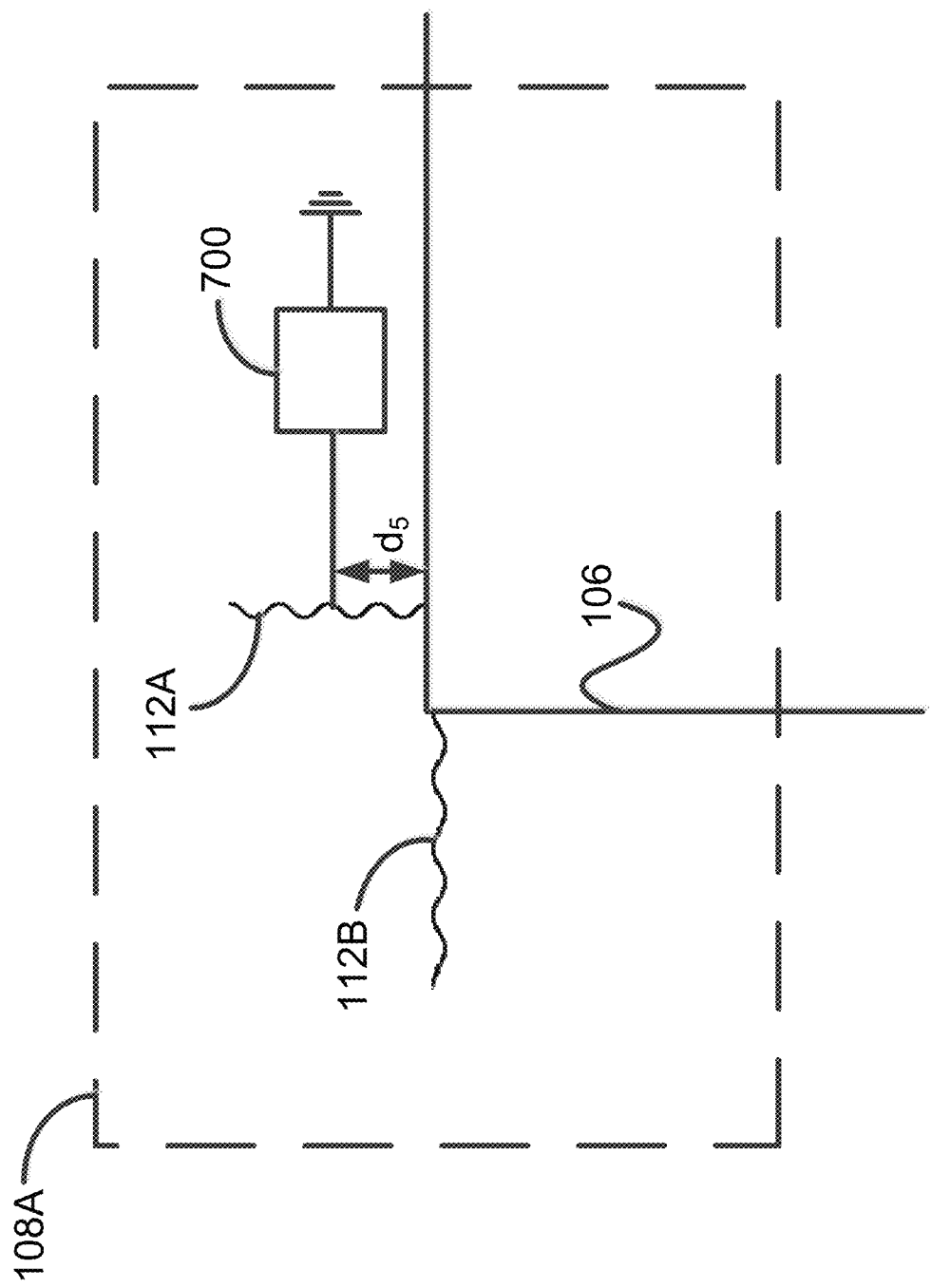
FIG. 5 is a diagram illustrating an example of the filter with a shunted resonant element, in accordance with at least some embodiments.

FIG. 5 is an example embodiment illustrating the filter 108a having at least one resonant element 112a shunted with a shunting component 700. In the case where the resonant element is a stub as illustrated in FIG. 5, the shunting component 700 is connected to the stub at a distance $d_5$ from the transmission line, which distance $d_5$ may or may not be equal to the stub length. The shunting component 700 may be an inductor, a capacitor, or a DC-SQUID (superconducting quantum interference device), which is a pair of Josephson junctions connected in parallel. The shunting component 700 may be provided on only one resonant element or all resonant elements of the filter 108a. One or more shunting component 700 may be provided in all of the filters of a microwave device 100 or in less than all of the filters of the microwave device 100. The shunting component 700 may be provided on all resonant elements of a microwave device 100 or on less than all of the resonant elements of the microwave device 100.

In some embodiments, the shunting element 700 is a DC-SQUID used to tune the filter 108a. When the DC-SQUID is modeled as a variable inductor of inductance L, the impedance of a stub of length/shunted at its end by a DC-SQUID can be derived as:

$$Z_{input} = Z_0 \frac{j\omega L + jZ_0 \tan\beta l}{Z_0 - j\omega L \tan\beta l}$$

where $Z_0$ is the stub's characteristic impedance, $$\beta = \frac{\omega}{c}$$

the wave number, $\omega$ the angular frequency, and c the speed of light in the material. The input impedance $Z_{input}$ goes to zero when $\omega L = -Z_0 \tan\beta l$ at resonance.

Figure 6A:
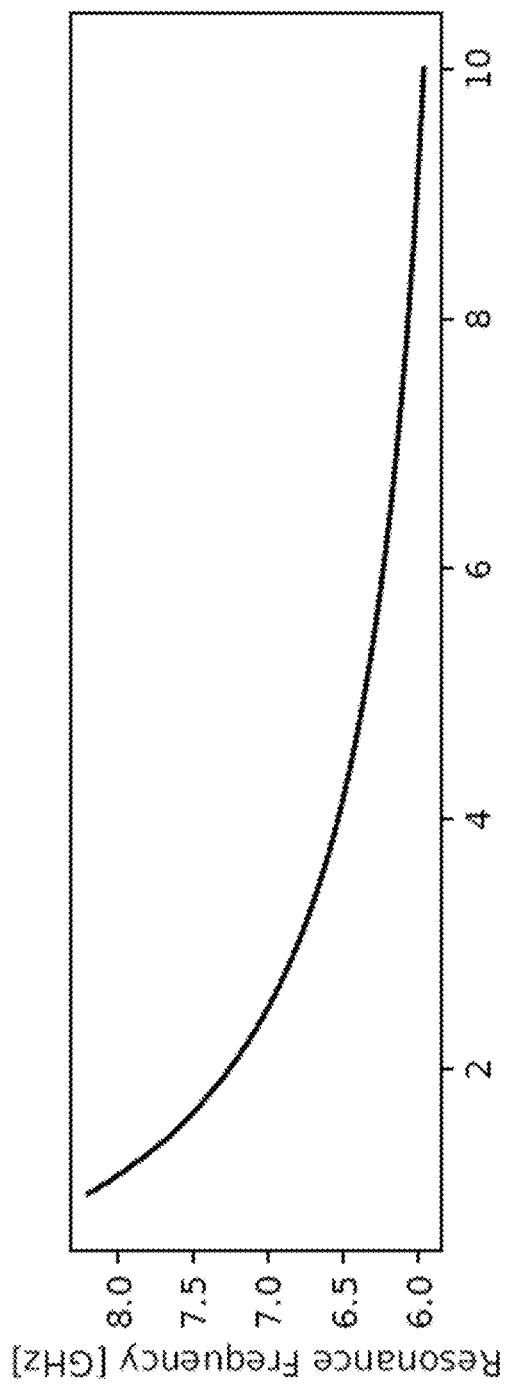
FIGS. 6A-6B are graphs of a resonance frequency and a derivative of the resonance frequency of a stub shunted by a SQUID, as a function of an inductance of the SQUID, in accordance with at least some embodiments.
Figure 6B:
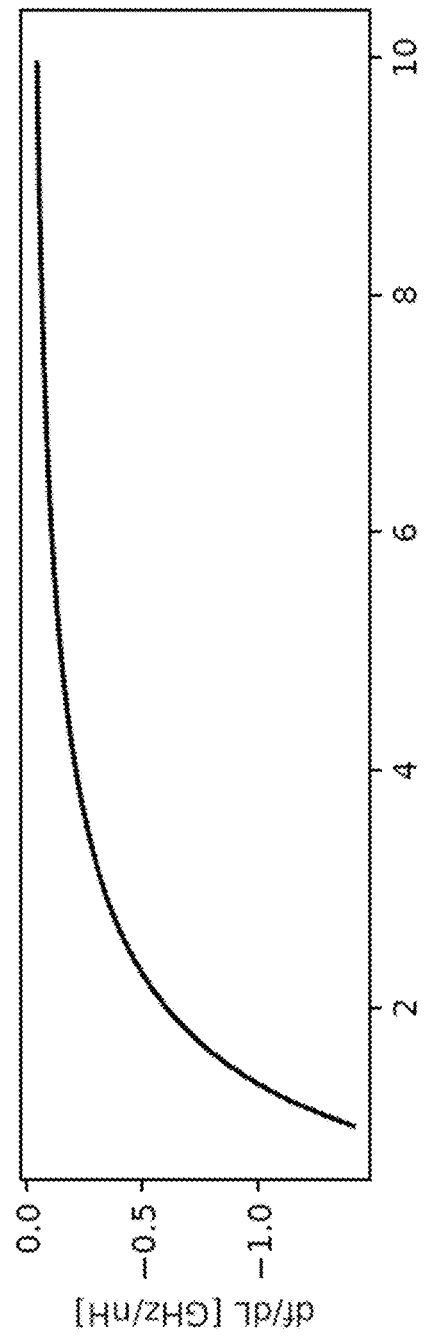

The equation for $Z_{input}=0$ may be numerically solved as a function of the inductance L. FIG. 6A shows the resonance frequency of a quarter-wavelength stub terminated by a DC-SQUID as a function of the inductance of the DC-SQUID. FIG. 6B shows the derivative of the resonance frequency. When the inductance is very large, the resonance frequency tends to the target frequency of the stub, i.e. 5.5 GHz in this case.

The inductance of a Josephson junction can be derived from the fundamental equation of the junction:

$$L_J = \frac{\phi_0}{2\pi I_c \cos\delta}$$

where $I_c$ is the junction critical current, $\delta$ is the superconducting phase across the junction and $\phi_0$ is the flux quantum. The critical current of a DC-SQUID is:

$$I_{c_{SQUID}} = 2I_c \left|\cos\frac{\pi\phi_x}{\phi_0}\right|$$

where $\phi_x$ is the external flux applied. From this critical current, an equivalent inductance for the DC-SQUID is written as:

$$L_{SQUID} = \frac{\phi_0}{4\pi I_c \left|\cos\frac{\pi\phi_x}{\phi_0}\right| \cos\delta}$$

In the absence of any external flux, the DC-SQUID inductance is half the Josephson junction inductance. For a Josephson junction inductance of 8 nH, this means that the SQUID inductance is expected to be 4 nH and it should increase by applying a flux. The resonance frequency variation at this inductance is 210 MHz/nH. Having a SQUID inductance of 4 nH shunting a 5.5 GHz stub should result in a filter tunable from 6.5 GHz to the target frequency of 5.5 GHz.

Figure 7A:
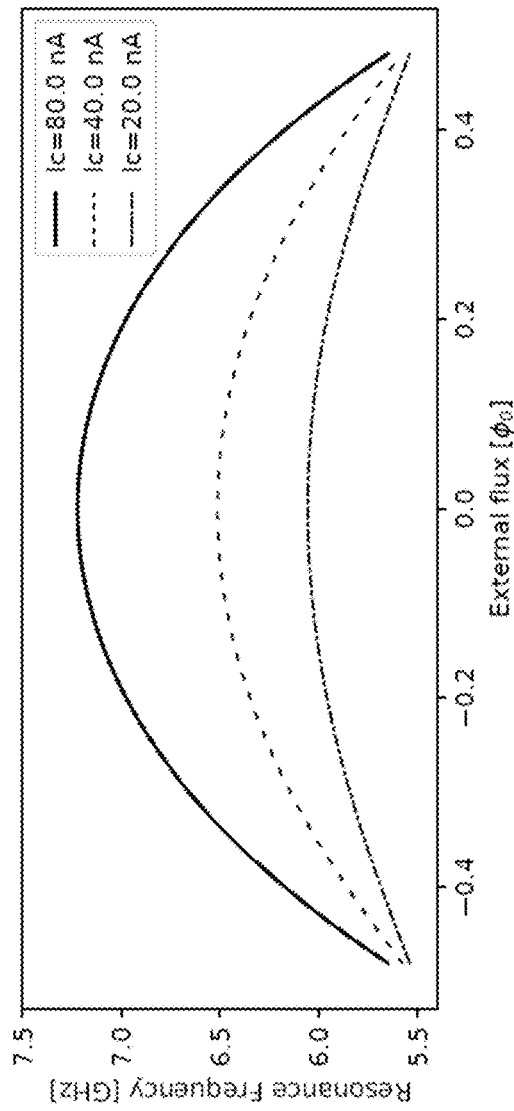
FIGS. 7A-7B are graphs of a resonance frequency and a derivative of the resonance frequency of a stub shunted by a SQUID, as a function of an external flux applied to the SQUID, in accordance with at least some embodiments.
Figure 7B:
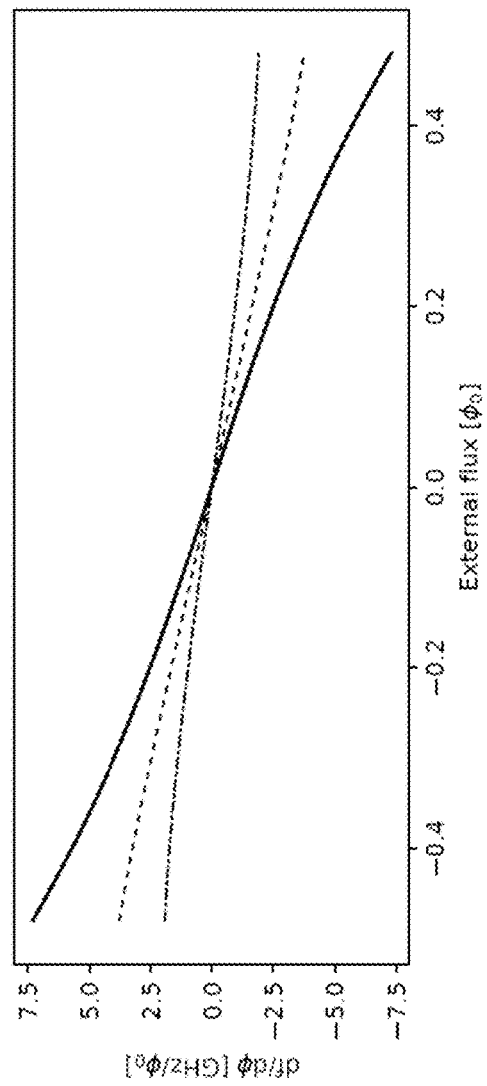

FIG. 7A shows the resonance frequency of the 5.5 GHz stub terminated by a DC-SQUID as a function of the external flux applied to the DC-SQUID in units of the flux quantum $\phi_0$ for different critical currents. The derivative of the resonance frequency with respect to the flux is shown in FIG. 7B. The maximal frequency that can be reached is at zero external flux and this frequency is set by the Josephson junction inductance. When the DC-SQUID inductance goes to infinity (when the external flux tends to 0.5 $\phi_0$), the resonance frequency is the target frequency of the stub, tied to its length.

Figure 8:
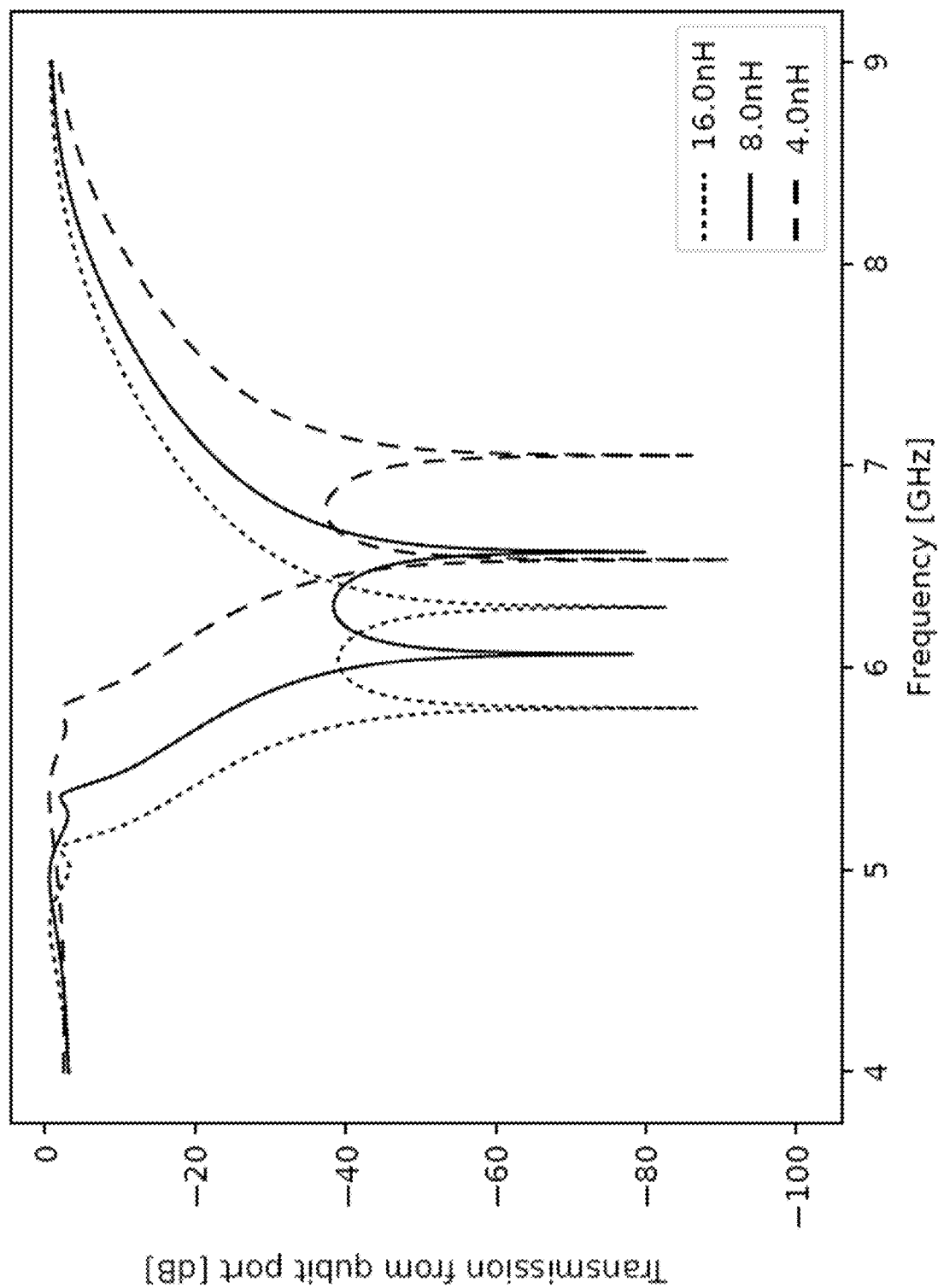
FIG. 8 is a graph of a frequency response of a filter having a SQUID shunting the stubs, for different values of the SQUID inductance, in accordance with at least some embodiments.
Figure 9:
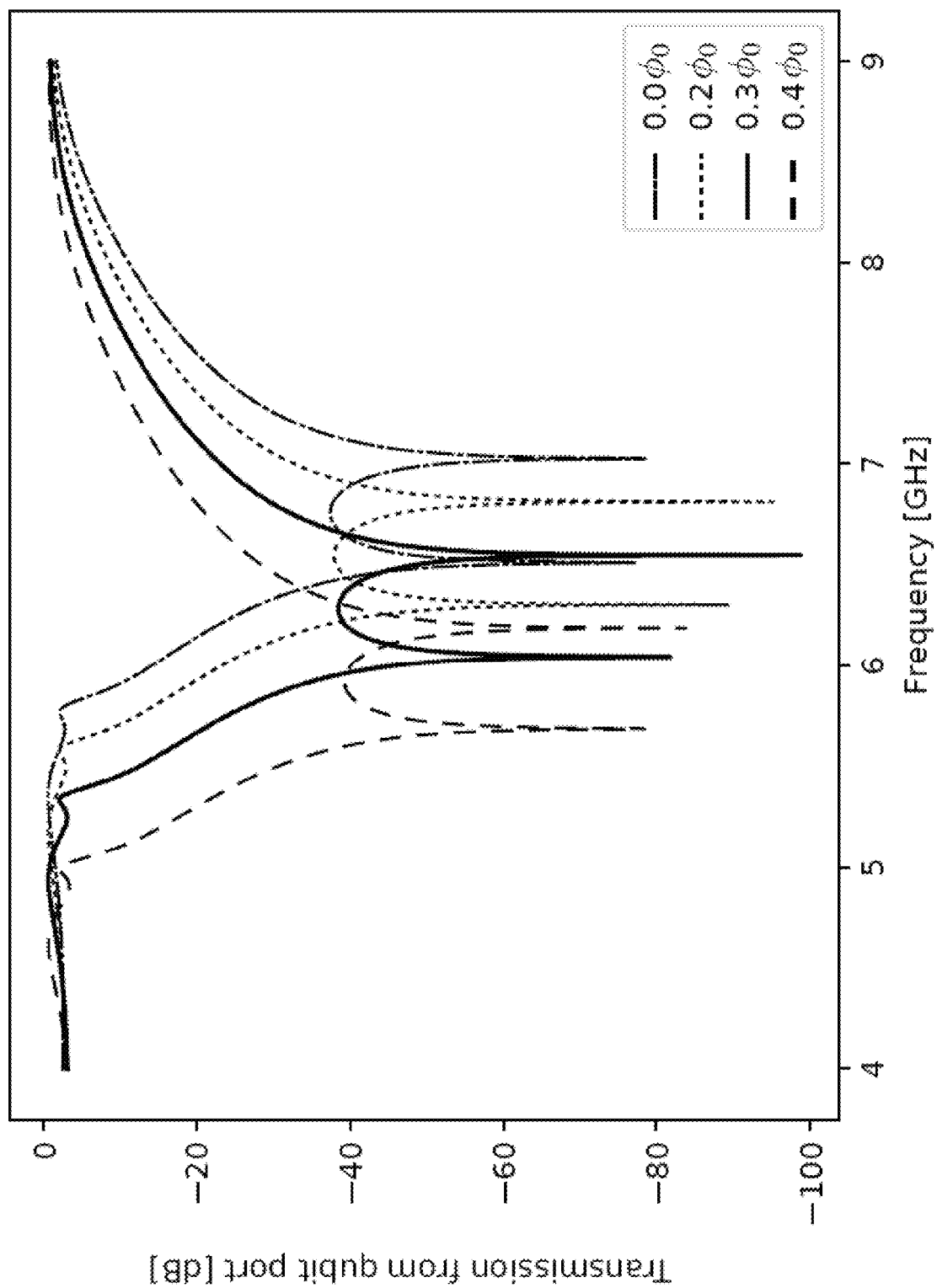
FIG. 9 is a graph of a frequency response of a filter having a SQUID shunting the stubs, for different fluxes applied to the SQUID, in accordance with at least some embodiments.
Figure 10:
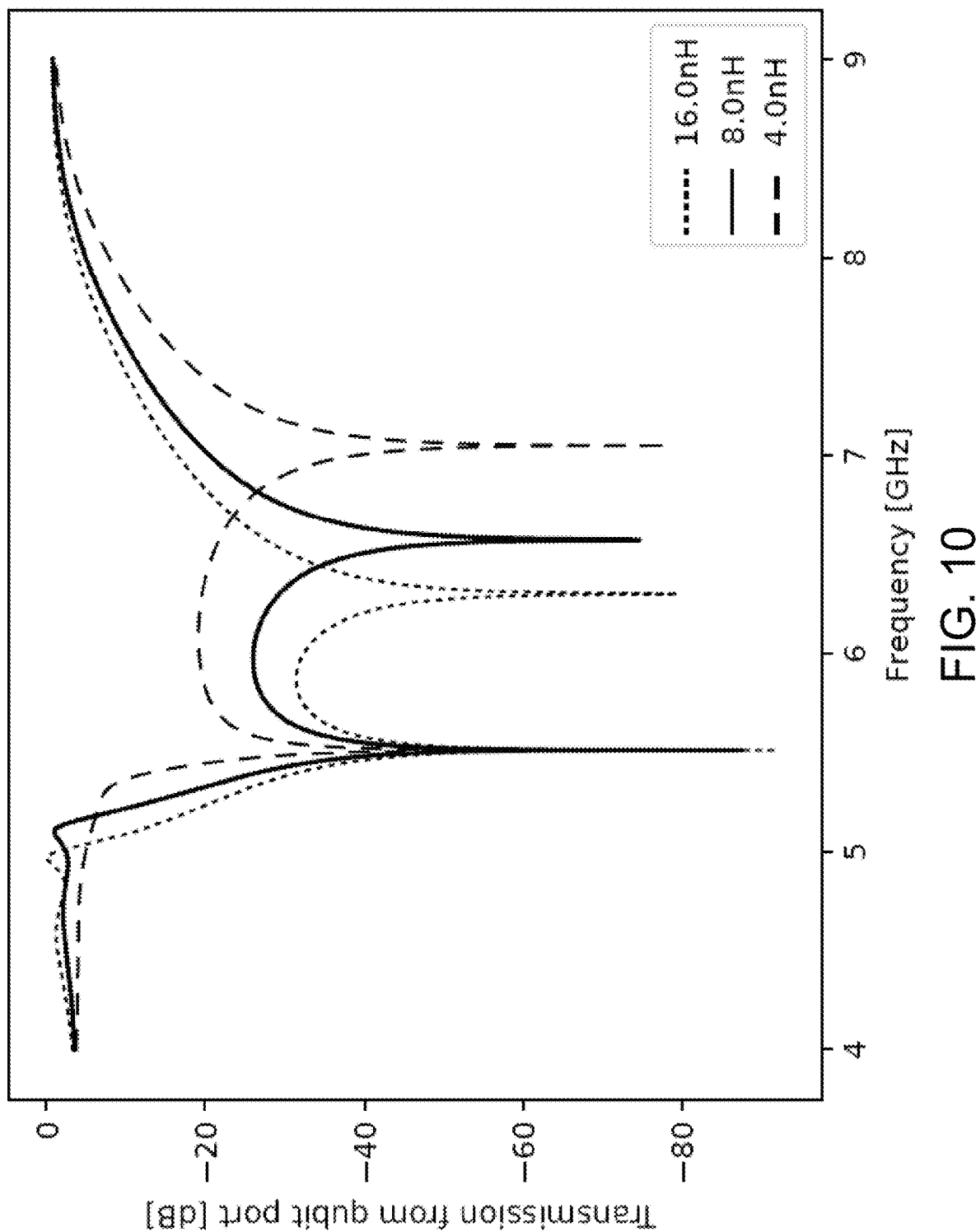
FIG. 10 is a graph of a frequency response of a filter having a SQUID shunting a single stub pair, for different values of the SQUID inductance, in accordance with at least some embodiments.

FIG. 8 shows a frequency response obtained by modeling a microwave device 100 having asymmetric filters 108a, 108b where every resonant element 112a, 112b, 112c, 112d is terminated with a DC-SQUID having the same inductance. The different curves represent different inductance values for the DC-SQUID. The filters 108a, 108b in this example can be tuned over 1 GHz and the suppression is maintained at 75 dB over the full tuning range. The filter spectrum as a function of the applied flux on the DC-SQUIDs is shown in FIG. 9. The different curves represent different fluxes applied to the DC-SQUIDs. $I_c$=40 nA is assumed. If only one pair of resonant elements (112a & 112d or 112b & 112c for an asymmetric design) is tunable, i.e. only one pair is terminated by DC-SQUIDs, the frequency response obtained is as shown in FIG. 10.

Figure 11A:
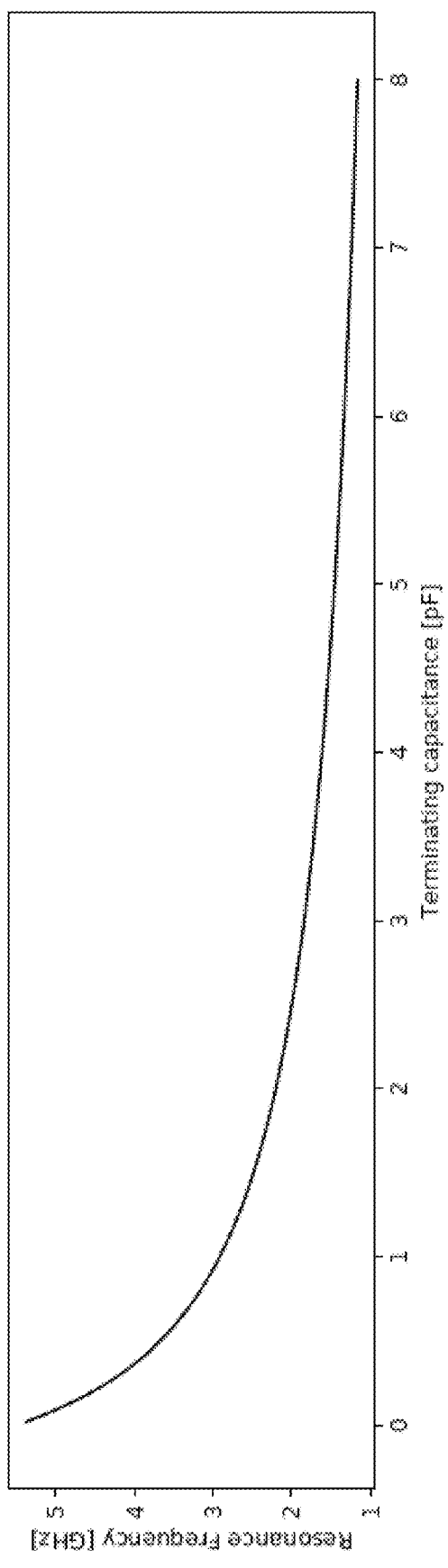
FIGS. 11A-11B are graphs of a resonance frequency and a derivative of the resonance frequency for a stub shunted by a capacitor, as a function of the capacitance, in accordance with at least some embodiments.
Figure 11B:
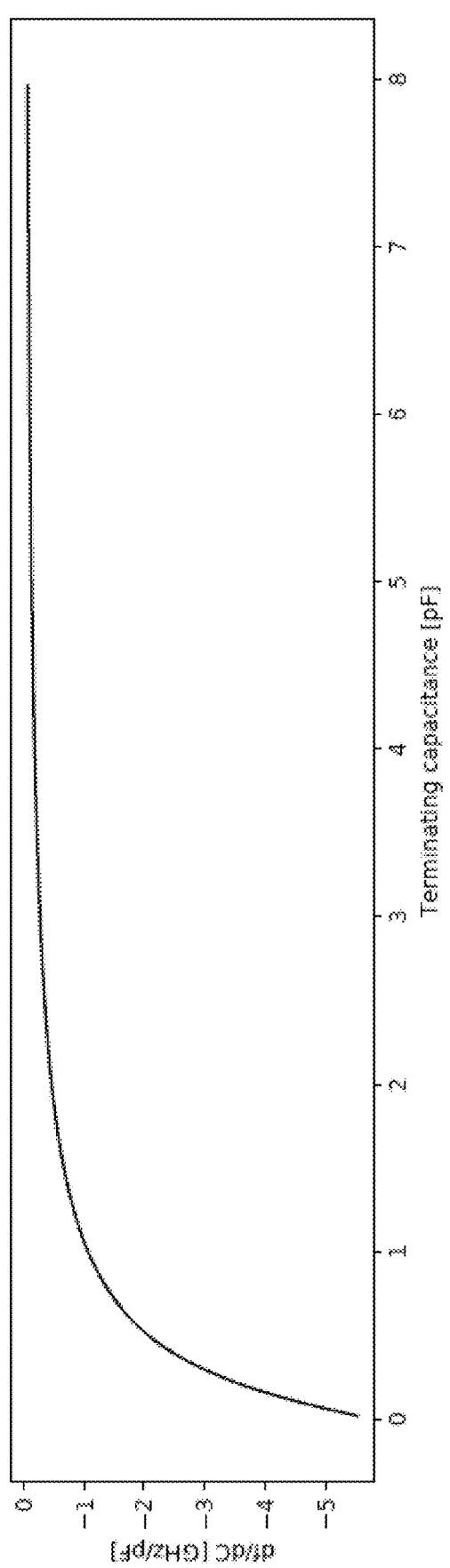

In some embodiments, the resonance frequency of the resonant elements 112a-112d is reduced by shunting it with a capacitor as the shunting component 700. An example of the resonance frequency of a quarter-wave stub terminated by a capacitor is illustrated in FIG. 11A. The derivative of the resonance frequency is illustrated in FIG. 11B. The target frequency is 5.5 GHz.

The same way shunting elements can be used to tune the frequency of filter 108a, shunting elements can also be used to tune the frequency of Purcell filter designs that involve one or more resonant element, such as those described herein as well as others.

Figure 12:
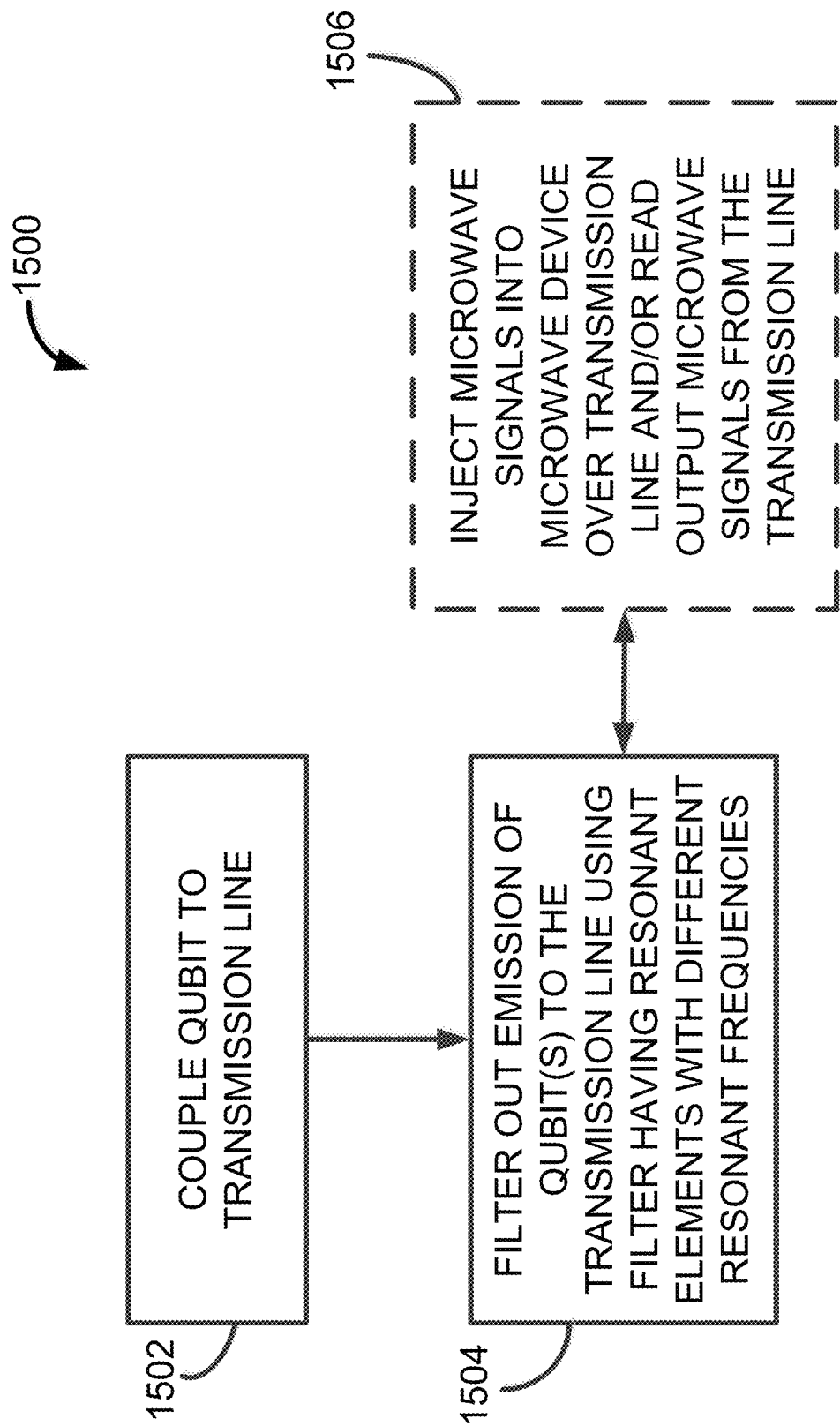
FIG. 12 is a flowchart of an example method for operating the microwave device while filtering out emissions of the qubit(s)

FIG. 12 illustrates a method 1500 for operating a microwave device, for example microwave device 100. The microwave device 100 has at least one qubit 102. At step 1502, the at least one qubit 102 is coupled to a transmission line 106 defining at least one port 110a. At step 1504, the emissions of the one or more qubits, such as qubit 102, are filtered out using a filter, such as filter 108a and/or filter 108b. The filter has a first resonant element having a first resonance frequency $f_1$, positioned along the transmission line between the first port and the qubit, and a second resonant element having a second resonance frequency $f_2$ different from $f_1$, positioned along the transmission line between the first resonant element and the qubit.

In some embodiments, at step 1506, a microwave signal is injected into the microwave device over the transmission line, for example via port 110a or 110b. Alternatively or in combination therewith, a microwave signal is read out from the transmission line at step 1506, for example as a reflection through a same port as the input port, or through a different port. Step 1506 may also be omitted in part or in whole from the method 1500.

In some embodiments, the filter is tuned by applying an external flux to one or more DC-SQUIDs shunting one or more of the resonant elements of the filter.

In some embodiments, a readout resonator coupes the qubit to the transmission line. In some embodiments, the input microwave signals and output microwave signals have a frequency corresponding to a resonance frequency $f_{rr}$ of the readout resonator coupling the qubit and the transmission line, and the resonance frequency $f_{rr}$ is different from a frequency of the qubit.

In some embodiments, the resonance frequency of the resonant element is modulated using an inductor and/or a capacitor shunting one or more of the resonant elements of the filter. The inductance or capacitance, respectively, of the shunting component is selected to obtain a desired resonance frequency.

It will be understood that the method 1500 may be applied to any of the embodiments of the filter and/or of the microwave device as described herein and equivalents thereof.

Figure 13:
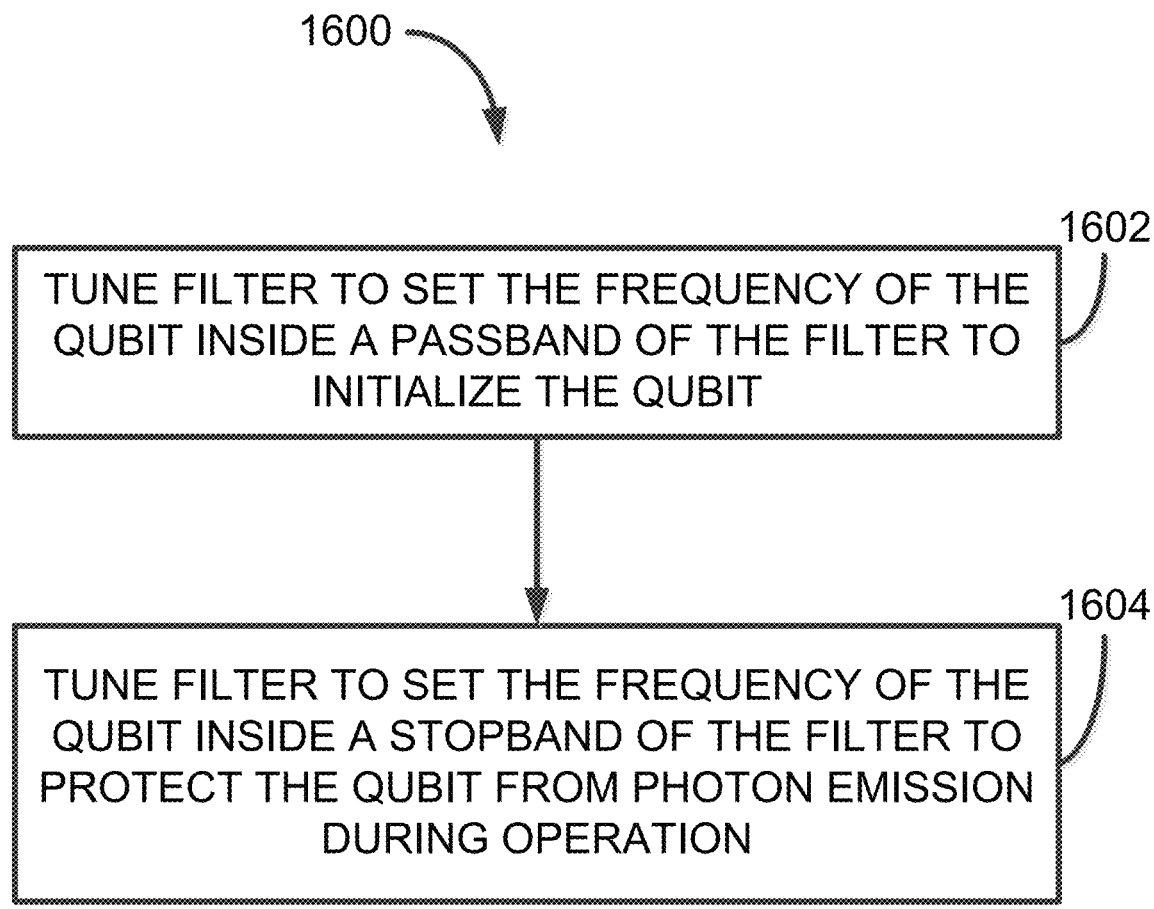
FIG. 13 is a flowchart of an example method for operating the microwave device including qubit initialization.

FIG. 13 illustrates another method 1600 for operating a microwave device, such as microwave device 100. The microwave device 100 has at least one qubit 102 coupled to a transmission line 106 defining at least one port 110*a*. The filter is provided with a tuning capability, for example by shunting one or more of the resonant elements with a DC-SQUID.

At step 1602, the filter is tuned so that the qubit frequency lies in the passband, i.e. outside of the stopband defined by $f_1$ and $f_2$. Tuning may be performed by applying a flux to the DC-SQUID. This allows the qubit to emit photons, thus resulting in a rapid decay of the qubit to a 0 state and initializing the qubit.

At step 1604, the filter is tuned so that the qubit frequency lies in the stopband defined by $f_1$ and $f_2$, by applying a different flux to the DC-SQUID. This protects the qubit from photon emission during regular operation of the microwave device 100.

In some embodiments, the filter has third and fourth resonant elements having resonance frequencies of $f_3$ and $f_4$, respectively.

It will be understood that tuning may be performed on one, many, or all of the resonant elements of the filter(s) provided in the microwave device. Various parameters may be used to perform the tuning as a function of the parameters of the filter, as will be understood by those skilled in the art.

It will also be understood that tuning may be performed on any embodiment of the filter and/or of the microwave device described herein and equivalents thereof.

In some embodiments, there is provided a filter for a microwave device having at least one superconducting qubit coupled to a transmission line defining at least one port. The filter comprises a first resonant element having a first resonance frequency $f_1$, positioned along the transmission line between the at least one port of the microwave device and the qubit. The filter comprises a second resonant element having a second resonance frequency $f_2$ different from $f_1$, positioned along the transmission line between the first resonant element and the qubit.

In some embodiments, the microwave device further comprises a readout resonator coupling the qubit and the transmission line.

In some embodiments, the transmission line further defines a second port, and the filter comprises third and fourth resonant elements. The third resonant element has a third resonance frequency $f_3$, and is positioned along the transmission line between the second port and the qubit. The fourth resonant element has a fourth resonance frequency $f_4$ and is positioned along the transmission line between the third resonant element and the qubit.

In some embodiments, the third resonance frequency $f_3$ is the same as the first resonance frequency $f_1$ and the fourth resonance frequency $f_4$ is the same as the second resonance frequency $f_2$. In some other embodiments, the third resonance frequency $f_3$ is the same as the second resonance frequency $f_2$ and the fourth resonance frequency $f_4$ is the same as the first resonance frequency $f_1$. In some embodiments, the resonance frequencies $f_1$, $f_2$, $f_3$, $f_4$ are between 4 GHz and 10 GHz.

In some embodiments, the first resonant element and the second resonant element and/or the third resonant element and the fourth resonant element are open-circuited stubs. In some other embodiments, the first resonant element and the second resonant element and/or the third resonant element and the fourth resonant element are short-circuited stubs. In some embodiments, a DC-SQUID, a capacitor, or an inductor is connected between the first or second resonant element and/or the third or fourth resonant element and ground.

The above description is meant to be exemplary only, and one skilled in the art will recognize that changes may be made to the embodiments described without departing from the scope of the invention disclosed. Still other modifications which fall within the scope of the present invention will be apparent to those skilled in the art, in light of a review of this disclosure.

Various aspects of the systems and methods described herein may be used alone, in combination, or in a variety of arrangements not specifically discussed in the embodiments described in the foregoing and is therefore not limited in its application to the details and arrangement of components set forth in the foregoing description or illustrated in the drawings. For example, aspects described in one embodiment may be combined in any manner with aspects described in other embodiments. Although particular embodiments have been shown and described, it will be apparent to those skilled in the art that changes and modifications may be made without departing from this invention in its broader aspects. The scope of the following claims should not be limited by the embodiments set forth in the examples, but should be given the broadest reasonable interpretation consistent with the description as a whole.

The invention claimed is:

1. A microwave device comprising:
    a transmission line defining a first port;
    at least one superconducting qubit coupled to the transmission line; and
    a filter comprising:
        a first resonant element having a first resonance frequency $f_1$, the first resonant element positioned along the transmission line between the first port and the qubit; and
        a second resonant element having a second resonance frequency $f_2$ different from $f_1$, the second resonant element positioned along the transmission line between the first resonant element and the qubit.

2. The microwave device of claim 1, further comprising a readout resonator coupling the qubit and the transmission line.

3. The microwave device of claim 1, wherein the transmission line defines a second port, and the filter comprises:
    a third resonant element having a third resonance frequency $f_3$, the third resonant element positioned along the transmission line between the second port and the qubit; and
    a fourth resonant element having a fourth resonance frequency $f_4$, the fourth resonant element positioned along the transmission line between the third resonant element and the qubit.

4. The microwave device of claim 3, wherein the third resonance frequency $f_3$ is the same as the first resonance frequency $f_1$ and the fourth resonance frequency $f_4$ is the same as the second resonance frequency $f_2$.

5. The microwave device of 3, wherein the third resonance frequency $f_3$ is the same as the second resonance frequency $f_2$ and the fourth resonance frequency $f_4$ is the same as the first resonance frequency $f_1$.

6. The microwave device of claim 1, wherein the first resonant element and the second resonant element are open-circuited stubs.

7. The microwave device of claim 1, wherein the first resonant element and the second resonant element are short-circuited stubs.

8. The microwave device of claim 1, wherein the filter comprises any one of a DC-SQUID, a capacitor, and an inductor connected between the first or second resonant element and ground.

9. The microwave device of claim 1, wherein the first resonant frequency $f_1$ and the second resonant frequency $f_2$ are between 4 GHz and 10 GHz.

10. The microwave device of claim 1, wherein the qubit is a transmon qubit.

11. A method for operating a microwave device having at least one superconducting qubit, the method comprising:
  coupling the at least one qubit to a transmission line defining at least one port; and
  filtering emissions of the at least one qubit to the transmission line using a filter comprising a first resonant element having a first resonance frequency $f_1$, positioned along the transmission line between the first port and the qubit, and a second resonant element having a second resonance frequency $f_2$ different from $f_1$, positioned along the transmission line between the first resonant element and the qubit.

12. The method of claim 11, further comprising at least one of injecting input microwave signals into the microwave device over the transmission line and reading output microwave signals from the transmission line.

13. The method of claim 12, wherein the input microwave signals and output microwave signals have a frequency corresponding to a resonance frequency $f_{rr}$ of a readout resonator coupling the qubit and the transmission line, and wherein the resonance frequency $f_{rr}$ is different from a frequency of the qubit.

14. The method of claim 11, wherein the transmission line defines a second port, and the filter comprises:
  a third resonant element having a third resonance frequency $f_3$, the third resonant element positioned along the transmission line between the second port and the qubit; and
  a fourth resonant element having a fourth resonance frequency $f_4$, the fourth resonant element positioned along the transmission line between the third resonant element and the qubit.

15. The method of claim 14, wherein the third resonance frequency $f_3$ is the same as the first resonance frequency $f_1$ and the fourth resonance frequency $f_4$ is the same as the second resonance frequency $f_2$.

16. The method of claim 14, wherein the third resonance frequency $f_3$ is the same as the second resonance frequency $f_2$ and the fourth resonance frequency $f_4$ is the same as the first resonance frequency $f_1$.

17. The method of claim 11, wherein the first resonant element and the second resonant element are open-circuited stubs.

18. The method of claim 11, wherein the first resonant element and the second resonant element are short-circuited stubs.

19. The method of claim 11, wherein the filter comprises any one of a DC-SQUID, a capacitor, and an inductor connected between the first or second resonant element and ground.

20. The method of claim 11, wherein the qubit is a transmon qubit.

* * * * *